(12) United States Patent
Izumiyama et al.

(10) Patent No.: US 6,838,932 B2
(45) Date of Patent: Jan. 4, 2005

(54) POWER AMPLIFIER CAPABLE OF ADJUSTING OPERATING POINT

(75) Inventors: Toru Izumiyama, Fukushima-ken (JP); Hideki Takeshita, Fukuhima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/440,921

(22) Filed: May 19, 2003

(65) Prior Publication Data

US 2003/0214352 A1 Nov. 20, 2003

(30) Foreign Application Priority Data

May 20, 2002 (JP) ........................................ 2002-145081

(51) Int. Cl.[7] .............................. H03F 1/14; H03G 3/30
(52) U.S. Cl. ........................................ 330/51; 330/285
(58) Field of Search ........................ 330/51, 127, 267, 330/273, 285, 296, 297

(56) References Cited

U.S. PATENT DOCUMENTS 5,060,294 A  * 10/1991 Schwent et al. .............. 330/51
6,218,906 B1    4/2001 Lohninger
6,297,694 B1 * 10/2001 Yamamoto .................... 330/51
6,300,837 B1   10/2001 Sowlati et al.
6,501,331 B2 * 12/2002 Adar ............................ 330/51
2001/0011926 A1  8/2001 Adar

FOREIGN PATENT DOCUMENTS

JP        H05-175757        7/1993

* cited by examiner

Primary Examiner—Khanh Van Nguyen
(74) Attorney, Agent, or Firm—Brinks Hofer Gilson & Lione (57) ABSTRACT

The present invention includes a power amplifying stage having a power amplifying element having a main electrode and a control electrode, and a bias control circuit that is supplied with a bias switching voltage and an operating point adjusting voltage for adjusting the bias voltage value to the control electrode of the power amplifying element by the bias switching voltage and the operating point adjusting voltage and hence adjusting the operating point of the power amplifying element, wherein the bias control circuit adjusts the operating point of the power amplifying element by switching between supply and stop of the bias voltage to the control electrode of the power amplifying element by the bias switching voltage, and varying the bias voltage value to be supplied to the control electrode of the power amplifying element by the operating point adjusting voltage in phase.

5 Claims, 3 Drawing Sheets

POWER AMPLIFIER CAPABLE OF ADJUSTING OPERATING POINT

BACKGROUND OF THE INVENTION

1. Field of the Invention

The present invention relates to a power amplifier that is capable of adjusting an operating point and, more specifically, to a power amplifier that is capable of adjusting an operating point, in which bias voltage to be supplied to a control electrode of a power amplifying element that constitutes the power amplifier is varied in phase and adjusting gain of the power amplifier corresponding to variations in bias voltage.

2. Description of the Related Art

In the related art, in a Wireless LAN, standardized specifications for wireless transmitting/receiving signals are established by IEEE (Institute of Electrical and Electronics Engineers). In this case, in one of the standardized specifications, IEEE802.11a, specifies that the type of the wireless transmitting/receiving signal is OFDM (Orthogonal Frequency Division Multiplexing) system, and a system in which a primary modulation varies from BPSK (Binary Phase Shift Keying) of 6 Mbps to 64 QAM (Quadrature Amplitude Modulation) of 54 Mbps by every transmission rate (transmission capacity), and specifies an allowable value of modulation accuracy (EVM) as a linear performance standard of the wireless transmitting/receiving signal by each transmission rate. For example, when the transmission rate is 6 Mbps, the allowable value is −5 dB (EVM= 56.2%). On the other hand, the higher the transmission rate, the severer the allowable value becomes, and thus when the transmission rate is 54 Mbps, only −25 dB (EVM=5.6%) is allowed. In this case, the transmission rates include 8 transmission rates of 6 Mbps, 9 Mbps, 12 Mbps, 18 Mbps, 24 Mbps, 36 Mbps, 48 Mbps, and 54 Mbps, and the transmission rate is selected depending on the distance to the person on the other end of the line, that is, electric field strength.

Generally, the fact that the linear performance of the wireless transmitting signal is determined mainly by the characteristics of the transmitting signal output amplifier (power amplifier) is known, and the fact that unnecessary signal components such as AM-AM conversion components or AM-PM conversion components are generated in the power amplifier when the linear performance of the power amplifier is not satisfactory, and such unnecessary signal components may cause deterioration of EVM is also known.

Therefore, it is also known that when designing a power amplifier that satisfies standards of IEEE802.11a, the power amplifier is required to have a linear performance that satisfies the allowable value of EVM when the transmission rate is high and the output power is required to have a high-output power characteristic within the allowable value of EVM, and that such characteristics may be satisfied by applying Class A bias on the power amplifier and flowing a relatively large operating current.

On the other hand, the Wireless LAN includes a miniature PCI (Programmable Communication Interface) card type integrated in a laptop computer, or PCMCIA (Personal Computer Memory Card International Association) type that can be externally inserted. However, since both types of Wireless LAN are supplied with operating power from a battery in the personal computer body. Therefore, when power consumption of the Wireless LAN increases, battery life of the personal computer body is shortened correspondingly. In this manner, although obtaining a satisfactorily linear performance characteristic contradicts reducing power consumption, the power amplifier in the Wireless LAN is basically desired to have low power consumption property that power consumption does not exceed a limit value and shortening of battery life is prevented.

Figure 5:
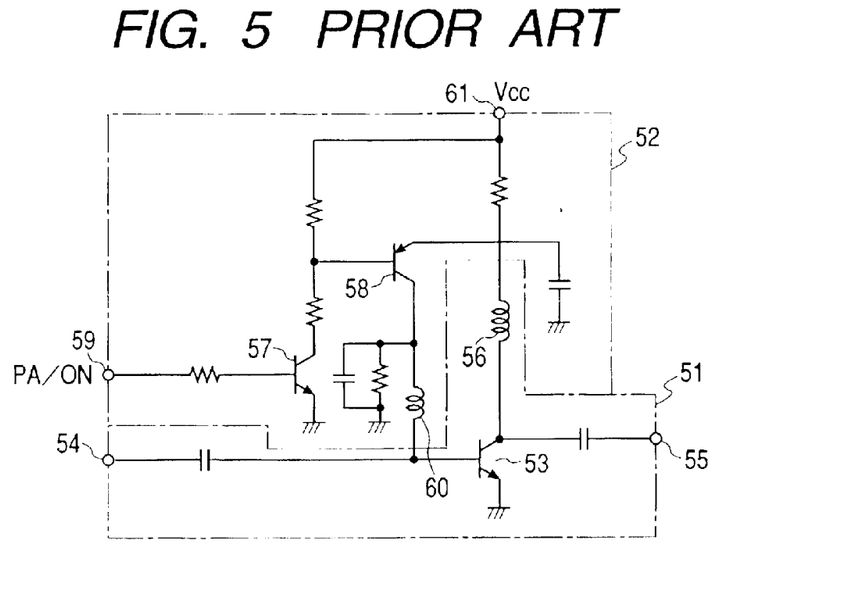
FIG. 5 is a circuit diagram showing an example of the structure of a known power amplifier in Wireless LAN.

FIG. 5 is a circuit diagram showing an example of the structure of a known transmitting signal output amplifier (power amplifier) in Wireless LAN, and showing an example in which a power amplifying stage includes independent elements.

As shown in FIG. 5, the power amplifier includes a power amplifying stage 51 and a bias control circuit 52. In this case, the power amplifying stage 51 includes a power amplifying transistor 53, a radio-frequency signal input terminal 54, a radio-frequency signal output terminal 55, and a load inductor 56. The bias control circuit 52 includes a first control transistor 57, a second control transistor 58, a power amplification stage drive signal (PA/ON) input terminal 59, an output inductor 60, and a power source terminal 61.

In the power amplifying stage 51, the power amplifying transistor 53 is connected in such a manner that a base is connected to a radio-frequency signal input terminal 54 trough a coupling capacitor (not designated by a numeral), and an emitter is grounded, and a collector is connected to a radio-frequency signal output terminal 55 through a coupling capacitor (not designated by a numeral). On the other hand, in the bias control circuit 52, the fist control transistor 57 is connected in such a manner that a base is connected to the power amplification stage drive signal input terminal 59 through an input resistance (not designated by a numeral), an emitter is grounded, and a collector is connected to a base of the second control transistor 58 through a resistance (not designated by a numeral). The second control transistor 58 is connected in such a manner that an emitter is connected to the power source terminal 61 through a resistance (not designated by a numeral) and a collector is connected to a base of the power amplifying transistor 53 through the output inductor 60.

The power amplifier constructed as described above acts as follows.

When a positive-level power amplification stage drive signal (PA/ON) is supplied to the power amplification stage drive signal input terminal 59, the power amplification stage drive signal is supplied to the first control transistor 57 and hence the first control transistor 57 is turned ON. When the first control transistor 57 is turned ON, the base of the second control transistor 58 is shifted to a negative level, and hence the second control transistor 58 is turned ON. When the second control transistor 58 is turned ON, a base bias voltage is supplied to the base of the power amplifying transistor 53 through the output inductor 60, and the power amplifying transistor 53 is brought into an actuating state. When a radio-frequency signal is supplied to the radio-frequency signal input terminal 54 at this moment, the power of the radio-frequency signal is amplified by the power amplifying transistor 53, and the amplified radio-frequency signal is supplied to the radio-frequency signal output terminal 55.

On the other hand, when a zero-leveled power amplification stage drive signal (PA/ON) is supplied to the power amplification stage drive signal input terminal 59, the first control transistor 57 is turned OFF by the power amplification stage drive signal. When the first control transistor 57 is turned OFF, the base of the second control transistor 58 is shifted into a positive level, and the second control transistor 58 is also turned OFF. When the second control transistor 58 is turned OFF, supply of a base bias voltage to the base of the power amplifying transistor 53 is stopped, and hence the power amplifying transistor 53 is brought into a nonaction state. Even when a radio-frequency signal is supplied to the radio-frequency signal input terminal 54 at this moment, the radio-frequency signal is blocked at the power amplifying transistor 53, no signal is supplied to the radio-frequency signal output terminal 55.

Figure 6:
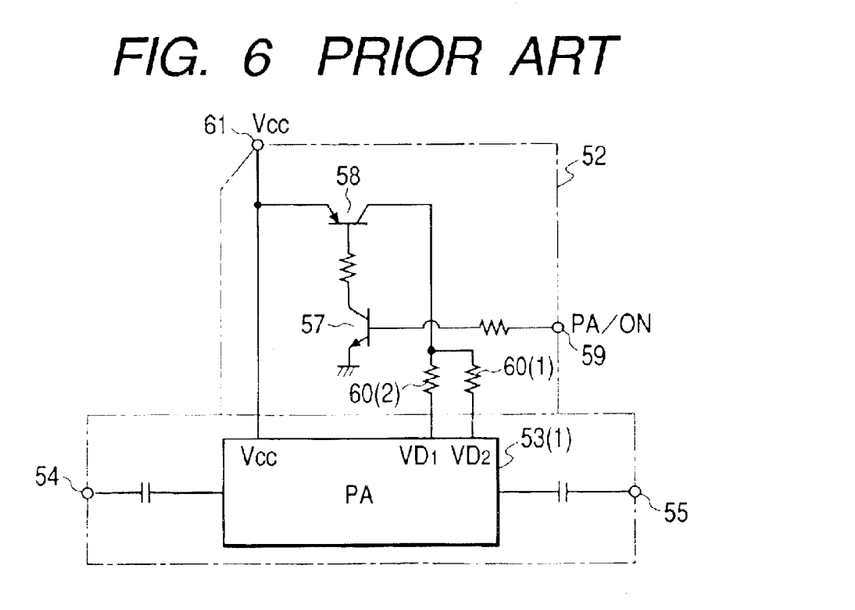
FIG. 6 is a circuit diagram showing another example of the construction of a known power amplifier in Wireless LAN.

FIG. 6 is a circuit diagram showing another example of the construction of a known transmitting signal output amplifier (power amplifier) in Wireless LAN, showing an example in which the power amplifying stage is constructed of a Microwave Monolithic Integrated Circuit (MMIC).

In FIG. 6, the same components as those shown in FIG. 5 are designated by the same reference numerals.

The example shown in FIG. 6 differs from the example shown in FIG. 5 in that a MMIC 53(1) is used instead of the power amplifying transistor 53 in the power amplifying stage 51, and two output resistances 60(1), 60(2) are used in the bias control circuit 52 instead of the output inductor 60. Other constructions are the same as the example shown in FIG. 5.

In this case, the MMIC 53(1) is connected to the radio-frequency signal input terminal 54 through a coupling capacitor (not designated by a numeral) at an input end, and to the radio-frequency signal output terminal 55 through a coupling capacitor (not designated by a numeral) at an output end. The second control transistor 58 is connected at the collector to bias supply ends VD1, VD2 of the MMIC 53(1) through two output resistances 60(1), 60(2).

The action of the power amplifier constructed as described above is basically the same as the action of the power amplifier shown in FIG. 5. When a positive level power amplification stage drive signal (PA/ON) is supplied to the power amplification stage drive signal input terminal 59, the first control transistor 57 is turned ON and hence the second control transistor 58 is also turned ON. When the second control transistor 58 is turned ON, a bias voltage is supplied to the bias supply ends VD1, VD2 of the MMIC 53(1) through the two output resistances 60(1), 60(2), and hence the MMIC 53(1) is brought into the actuating state. When a radio-frequency signal is supplied to the radio-frequency signal input terminal 54 at this moment, the power of the radio-frequency signal is amplified by the MMIC 53(1), and the amplified radio-frequency signal is supplied to the radio-frequency signal output terminal 55.

On the other hand, when a zero-level power amplification stage drive signal (PA/ON) is supplied to the power amplification stage drive signal input terminal 59, the first control transistor 57 is turned OFF and the second control transistor 58 is also turned OFF. When the second control transistor 58 is turned OFF, supply of a bias voltage to the bias supply ends VD1, VD2 of the MMIC 53(1) is stopped, and hence the MMIC 53(1) is brought into a nonaction state. Even when a radio-frequency signal is supplied to the radio-frequency signal input terminal 54 at this moment, the radio-frequency signal is blocked at the MMIC 53(1), and no signal is supplied to the radio-frequency signal output terminal 55.

Each of the known power amplifiers described above is operated at a constant bias voltage irrespective of the transmission rate used and, more specifically, when the transmission rate is 6 Mbps, Class AB bias voltage is provided within a range that power consumption of the power amplifying transistor 53 or the MMIC 53(1) does not exceed the limit value, so that the maximum output can be obtained within the allowable range of the output power. Therefore, when the transmission rate reaches to a high transmission rate such as 48 Mbps or 54 Mbps, it is constrained by the linear performance standard, and the output voltage is reduced (backed off) to the value lower than that obtained when the transmission rate is 6 Mbps to operate at a low output power. Therefore, when comparing the output power obtained when the transmission rate is 6 Mbps with the output power obtained when the transmission rate is 54 Mbps, there is a difference in the order of 6 to 7 dB.

On the other hand, when the bias of the power amplifying transistor 53 or the MMIC 53(1) to be obtained when the transmission rate of 6 Mbps is switched from Class AB to Class AB close to Class A in order to increase the output power obtained when the transmission rate is 54 Mbps, power consumption when the transmission rate is 6 Mbps increases, and comes near or exceeds the limit value.

In contrast, when the bias of the power amplifying transistor 53 or the MMIC 53(1) to be obtained when the transmission rate is 6 Mbps is switched from Class AB to Class AB close to Class B in order to reduce power consumption obtained when the transmission rate is 6 Mbps, it is subjected to constraint of the linear performance standard unless the output power obtained when the transmission rate is 54 Mbps is further reduced.

SUMMARY OF THE INVENTION

In view of such circumstances, an object of the present invention is to provide a power amplifier that is capable of adjusting the operating point, in which the output of the bias control circuit for supplying a bias voltage to the power amplifying stage is varied in phase to achieve reduction of power consumption and improvement of the linear performance.

In order to achieve the above-described object, the present invention includes a power amplifying stage having a power amplifying element having a main electrode and a control electrode, and a bias control circuit that is supplied with a bias switching voltage and an operating point adjusting voltage for adjusting the bias voltage value to the control electrode of the power amplifying element by the bias switching voltage and the operating point adjusting voltage and hence adjusting the operating point of the power amplifying element, wherein the bias control circuit includes a unit for adjusting the operating point of the power amplifying element by switching between supply and stop of the bias voltage to the control electrode of the power amplifying element by the bias switching voltage, and varying the bias voltage value to be supplied to the control electrode of the power amplifying element by the operating point adjusting voltage in phase.

According to the aforementioned unit, the power amplifying element is adapted to be switched between the amplifying action and the non-amplifying action by supplying a switching voltage to the bias control circuit to eliminate power consumption by the power amplifying element in non-amplifying action, and a supplied bias voltage value may be selected by supplying an operating point adjusting voltage having phased bias voltage values to the bias control circuit. Therefore, the power amplifying element can be set to an operating point suitable to that moment, and thus power consumption of the power amplifying stage can be maintained constantly at the value lower than the limit value, as well as the output signal can be controlled so as to satisfy the linear performance standard.

In this case, the operating point adjusting voltage in the aforementioned unit includes a binary voltage for selectively setting to one of two operating points of the power amplifying element.

In this arrangement, the power amplifying element can be set to either one of the operating points suitable to that moment with a relatively simple unit, whereby power consumption of the power amplifying stage can be constantly maintained at a value below the limit value, and the output signal can be controlled to a value satisfying the linear performance standard.

The operating point adjusting voltage in the aforementioned unit includes phased analogue voltages for selectively setting the operating point of the power amplifying element to one of tree or more operating points.

In this arrangement, the power amplifying element can be set to one of the operating point suitable to that moment with high degree of accuracy, whereby power consumption of the power amplifying stage can be constantly maintained at the value below the limit value, and the output signal can be controlled to a value satisfying the linear performance standard.

DESCRIPTION OF THE PREFERRED EMBODIMENTS

Referring now to the drawings, embodiments of the present invention will be described below.

Figure 1:
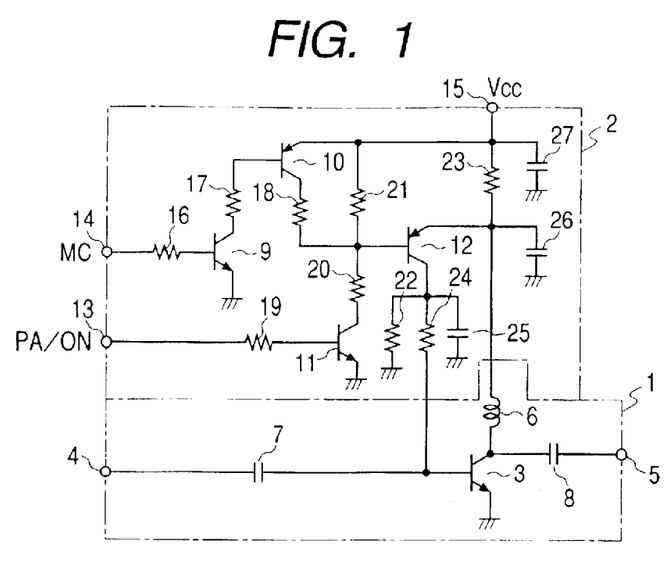
FIG. 1 is a circuit diagram according to a first embodiment of a power amplifier that is capable of adjusting the operating point according to the present invention, showing a construction of principal portion.

FIG. 1 is a circuit diagram according to a first embodiment of a power amplifier that is capable of adjusting the operating point according to the present invention, showing a construction of principal portion in which a power amplifying stage is constructed of independent elements.

As shown in FIG. 1, the power amplifier according to the first embodiment includes a power amplifying stage 1 and a bias control circuit 2. In this case, the power amplifying stage 1 includes a power amplifying transistor 3, a radio-frequency signal input terminal 4, a radio-frequency signal output terminal 5, a load inductor 6, a first coupling capacitor 7, and a second coupling capacitor 8. The bias control circuit 2 includes a first control transistor 9, a second control transistor 10, a third control transistor 11, a fourth control transistor 12, a bias switching voltage (PA/ON) input terminal 13, a mode control voltage (MC) input terminal 14, a power source terminal 15, a first resistance 16, a second resistance 17, a third resistance 18, a fourth resistance 19, a fifth resistance 20, a sixth resistance 21, a seventh resistance 22, a eighth resistance 23, an output inductor 24, a first capacitor 25, a second capacitor 26, and a third capacitor 27.

In the power amplifying stage 1, the power amplifying transistor 3 is connected in such a manner that a base is connected to the radio-frequency signal input terminal 4 through the first coupling capacitor 7, an emitter is grounded, and a collector is connected to the radio-frequency signal output terminal 5 through the second coupling capacitor 8 and to the power source terminal 15 through the load inductor 6 and the eighth resistance 23. In the bias control circuit 2, the first control transistor 9 is connected in such a manner that a base is connected to the mode control voltage input terminal 14 through the first resistance 16, an emitter is grounded, and a collector is connected to a base of the second control transistor 10 through the second resistance 17. The second control transistor 10 is connected in such a manner that an emitter is connected to the power source terminal 15 and to a base of the fourth control transistor 12 through the sixth resistance 21 and the collector is connected to the base of the fourth control transistor 12 through the third resistance 18. The third control transistor 11 is connected in such a manner that a base is connected to a the bias switching voltage input terminal 13 through the fourth resistance 19, an emitter is grounded, and a collector is connected to a base of the fourth control transistor 12 through the fifth resistance 20. The fourth control transistor 12 is connected in such a manner that a base is connected to the power source terminal 15 through the sixth resistance 21, an emitter is connected to the power source terminal 15 through the eighth resistance 23, and a collector is connected to the base of the power amplifying transistor 3 through the output inductor 24 and grounded through the seventh resistance 22. The first capacitor 25 is connected to a point between the collector of the fourth control transistor 12 and the grounded point, the second capacitor 26 is connected to a point between the emitter of the fourth control transistor 12 and the grounded point, and the third capacitor 27 is connected to a point between the power source terminal 15 and the grounded point.

The power amplifier in the arrangement described above acts as follows.

When a positive level bias switching voltage (PA/ON) is supplied to the bias switching voltage input terminal 13 and is supplied to the third control transistor 11, the third control transistor 11 is turned ON, whereby the voltage of the collector is lowered. Then, the fourth control transistor 12 is turned ON, and hence a base bias voltage is supplied from the collector thereof to the base of the power amplifying transistor 3 through the output inductor 24, whereby the power amplifying transistor 3 is brought into the power amplifying state. When a radio-frequency signal is supplied to the radio-frequency signal input terminal 4 at this moment, the power of the radio-frequency signal is amplified by the power amplifying transistor 3, and the amplified radio-frequency signal is supplied to the radio-frequency signal output terminal 5.

On the other hand, when a zero-level bias switching voltage (PA/ON) is supplied to the bias switching voltage input terminal 13 and then supplied to the third control transistor 11, the third control transistor 11 is turned OFF, whereby the fourth control transistor 12 is also turned OFF.

When the fourth control transistor 12 is turned OFF, supply of a base bias voltage from the collector of the fourth control transistor 12 to the base of the power amplifying transistor 3 is stopped, and hence the power amplifying transistor 3 is brought into the non-amplifying state. Even when a radio-frequency signal is supplied to the radio-frequency signal input terminal 4 at this moment, the radio-frequency signal is blocked at the power amplifying transistor 3, and thus no signal is supplied to the radio-frequency signal output terminal 5.

When a low level (L) mode control voltage is supplied to the mode control voltage input terminal 14 and the mode control voltage is supplied to the first control transistor 9 while the positive level bias switching voltage (PA/ON) is supplied to the bias switching voltage input terminal 13, the first control transistor 9 is turned OFF or nearly turned OFF, and simultaneously, the second control transistor 10 is also turned OFF or nearly turned OFF. At this moment, a base voltage of the fourth control transistor 12 is lowered due to lowering of a bypass current at the sixth resistor 21. Therefore, the bias control circuit 2 is set so that a collector current of the fourth control transistor 12 is increased, and the increased collector current flows into the base of the power amplifying transistor 3, whereby the operating point of the power amplifying transistor 3 is shifted from Class AB to Class AB close to Class A. By such a setting, an amplifying characteristic that improves the linear performance of the output radio-frequency signal in a state in which power consumption of the power amplifier is slightly increased can be obtained, and thus an output suitable for a high transmission rate may be generated.

When a high-level (H) mode control voltage is supplied to the mode control voltage input terminal 14 and the mode control voltage is supplied to the first control transistor 9 while a positive level bias switching voltage (PA/ON) is supplied to the bias switching voltage input terminal 13, the first control transistor 9 is turned ON and, simultaneously, the second control transistor 10 is also turned ON. At this moment, a base voltage of the fourth control transistor 12 is increased due to increase of a bypass current at the sixth resistance 21. Therefore, the bias control circuit 2 is set so that a collector current of the fourth control transistor 12 is reduced, and the reduced collector current flows into the base of the power amplifying transistor 3, whereby the operating point of the power amplifying transistor 3 is shifted from Class AB to Class AB close to Class B. By such a setting, an amplifying characteristic that satisfies the linear performance standard of the output radio-frequency signal can be obtained in a state in which power consumption of the power amplifier is reduced, and thus an output suitable for a low transmission rate may be generated.

Figure 2:
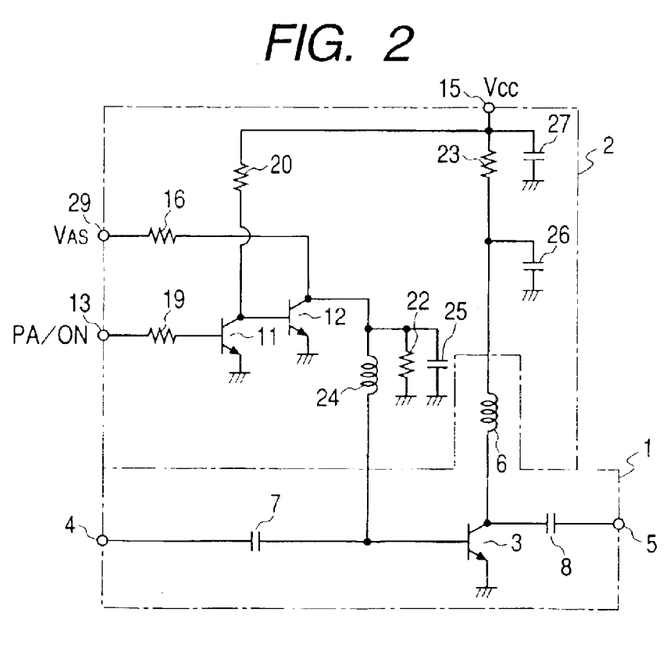
FIG. 2 is a second embodiment of a power amplifier that is capable of adjusting an operating point according to the present invention, showing a construction of a principal portion.

FIG. 2 is a second embodiment of a power amplifier that is capable of adjusting an operating point according to the present invention, showing a construction of a principal portion in which a power amplifying stage is constructed of independent elements.

In FIG. 2, the same components as those shown in FIG. 1 are designated by the same reference numerals. In the description described below, the power amplifier according to the first embodiment is referred to as a first embodiment, and the power amplifier according to the second embodiment is referred to as a second embodiment.

As shown in FIG. 2, the second embodiment includes a power amplifying stage 1 and a bias control unit 2. The construction of the power amplifying stage 1 is the same as the construction of the power amplifying stage 1 of the first embodiment. The bias control circuits 2 differ in construction in that the first embodiment employs a binary mode control voltage (MC) including a low level (L) and a high level (H) as an operating point adjusting voltage, while the second embodiment employs a phased analogue voltage (Vas).

In other words, when comparing the bias control circuit 2 of the second embodiment (hereinafter referred to as a "former") with the bias control circuit 2 of the first embodiment (hereinafter referred to as a "latter"), the former does not include the first control transistor 9, the second control transistor 10, the mode control voltage (MC) input terminal 14, the second resistance 17, the third resistance 18, and the sixth resistance 21, which are include in the latter, and additionally includes a phased analogue voltage (Vas) input terminal 29 instead.

In the former, a base of a fourth control transistor 12 is directly connected to a collector of a third control transistor 11, and the collector is connected to the phased analogue voltage input terminal 29 through a first resistance 16. Other connecting conditions are the same as those of the latter.

The power amplifier constructed as described above acts as follows.

When a zero-level bias switching voltage (PA/ON) is supplied to a bias switching voltage input terminal 13, and to the third control transistor 11, the third control transistor 11 is turned OFF, whereby a collector voltage increases. Then, the fourth control transistor 12 is turned ON, and a base bias voltage is supplied from the collector to the base of a power amplifying transistor 3 through the output inductor 24, so that the power amplifying transistor 3 is shifted to the power amplifying state. In this state, when a radio-frequency signal is supplied to a radio-frequency signal input terminal 4, the power of the radio-frequency signal is amplified at the power amplifying transistor 3, and the amplified radio-frequency signal is supplied to a radio-frequency signal output terminal 5.

On the other hand, when a positive level bias switching voltage (PA/ON) is supplied to the bias switching voltage input terminal 13, and then to the third control transistor 11, the third control transistor 11 is turned ON, whereby the collector voltage is lowered. Then, the fourth control transistor 12 is turned OFF, whereby supply of a base bias voltage from the collector to the base of the power amplifying transistor 3 is stopped. As a consequence, the power amplifying transistor 3 is shifted to the non-amplifying state. Even when a radio-frequency signal is supplied to the radio-frequency signal input terminal 4 at this moment, the radio-frequency is blocked at the power amplifying transistor 3, and is not supplied to the radio-frequency signal output terminal 5.

When an analogue voltage (Vas) at one of the phases is supplied to the phased analogue voltage input terminal 29 while a zero-level bias switching voltage (PA/ON) is supplied to the bias switching voltage input terminal 13 and the fourth control transistor 12 is in the OFF state, the analogue voltage is transmitted to the base of the power amplifying transistor 3 through the collector of the fourth control transistor 12 in the OFF state, and the operating point of the power amplifying transistor 3 is set to an operating point corresponding to the analogue voltage value. In other words, when the phase of the analogue voltage supplied to the analogue voltage input terminal 29 is relatively large, and the analogue voltage is large, the operating point of the power amplifying transistor 3 is set to be shifted from Class AB to Class AB close to Class A corresponding to the analogue voltage value, and when the phase of the analogue voltage is relatively small, and the analogue voltage value is small, the operating point of the power amplifying transistor 3 is set to be shifted from Class AB to Class AB close to Class B corresponding to the analogue voltage value.

In this case, an analogue voltage that is capable of being shifted into eight phases is used as a phased analogue voltage, as an example. At each of eight phases of the analogue voltage, the operating point of the power amplifying transistor 3 is set to eight phases; Class AB close to Class B 1, Class AB close to Class B 2, Class AB close to Class B 3, Class AB, Class AB close to Class A 1, Class AB close to Class A 2, Class AB close to Class A 3, and Class AB close to Class A 4. In this case, the smaller the values of Class AB close to Class B 1 to 3, the closer to Class B, and the larger the value of Class AB close to Class A 1 to 4, the value is closer to Class A.

When the operating point of the power amplifying transistor 3 is set to Class AB close to Class A, an amplifying characteristic that provides preferable linear performance of the output radio-frequency signal in a state in which power consumption of the power amplifier is slightly increased can be obtained, and an output suitable to the operation at high transmission rate can be generated depending to the setting state. When the operating point of the power amplifying transistor 3 is set to Class AB close to Class B, an amplifying characteristic that satisfies the linear performance standard of the output radio-frequency signal can be obtained in a state in which power consumption of the power amplifier is reduced, and thus an output suitable to the operation at a low transmission rate can be generated.

In this manner, according to the power amplifier of the second embodiment, an output that is most suitable to that moment can be generated by varying the analogue voltage value of the phased analogue voltage corresponding to the required transmission rates.

Figure 3:
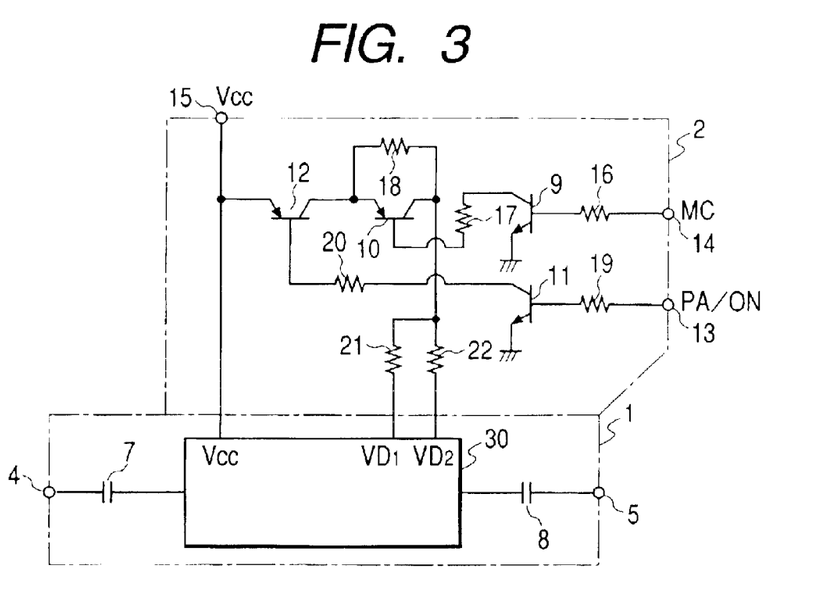
FIG. 3 is a third embodiment of a power amplifier that is capable of adjusting an operating point according to the present invention, showing a construction of a principal portion.

FIG. 3 is a third embodiment of a power amplifier that is capable of adjusting an operating point according to the present invention, showing a construction of a principal portion in which a power amplifying stage is constructed of a Microwave Monolithic Integrated Circuit (MMIC).

As shown in FIG. 3, the power amplifier according to the third embodiment includes a power amplifying stage 1, and a bias control circuit 2. In this case, the power amplifying stage 1 includes an MMIC 30, a radio-frequency signal input terminal 4, a radio-frequency signal output terminal 5, a first coupling capacitor 7, and a second coupling capacitor 8. The bias control circuit 2 includes a first control transistor 9, a second control transistor 10, a third control transistor 11, a fourth control transistor 12, a bias switching voltage (PA/ON) input terminal 13, a mode control voltage (MC) input terminal 14, a power source terminal 15, a first resistance 16, a second resistance 17, a third resistance 18, a fourth resistance 19, a fifth resistance 20, a sixth resistance 21, and a seventh resistance 22.

In the power amplifying stage 1, the MMIC 30 is connected at its input end thereof to the radio-frequency signal input terminal 4 through the first coupling capacitor 7, at its output end thereof to the radio-frequency signal output terminal 5 through the second coupling capacitor 8, and a power supply end (VCC) is connected to the power source terminal 15. In the bias control circuit 2, the first control transistor 9 is connected in such a manner that a base is connected to the mode control voltage input terminal 14 through the first resistance 16, an emitter is grounded, and a collector is connected to the base of the second control transistor 10 through the second resistance 17. The second control transistor 10 is connected in such a manner that an emitter is connected to a collector of the fourth control transistor 12, a collector is connected to bias voltage supplying ends VD1, VD2 of the MMIC 30 through the sixth resistance 21 and the seventh resistance 22, and the third resistance 18 is connected to a point between the collector and the emitter. The third control transistor 11 is connected in such a manner that a base is connected to the bias switching voltage input terminal 13 through the fourth resistance 19, an emitter is grounded, a collector is connected to a base of the fourth control transistor 12 through the fifth resistance 20. An emitter of the fourth control transistor 12 is connected to the power source terminal 15. The mode control voltage (MC) of the present embodiment corresponds to the operating point adjusting voltage in claims.

The power amplifier in the arrangement described above acts as follows.

When a positive level bias switching voltage (PA/ON) is supplied to the bias switching voltage input terminal 13, and then to the third control transistor 11, the third control transistor 11 is turned ON, whereby the collector voltage is lowered. Then, the fourth control transistor 12 is turned ON. Then a bias voltage is supplied from the collector to the bias voltage supplying ends VD2, VD2 of the MMIC 30 via the sixth resistance 21 and the seventh resistance 22, and the MMIC 30 is shifted to the amplifying state. When a radio-frequency signal is supplied to the radio-frequency signal input terminal 4 at this moment, the power of the radio-frequency is amplified at the MMIC 30, and the amplified radio-frequency signal is supplied to the radio-frequency signal output terminal 5.

On the other hand, when a zero-level bias switching voltage (PA/ON) is supplied to the bias switching voltage input terminal 13, and then to the third control transistor 11, the third control transistor 11 is turned OFF, whereby the fourth control transistor 12 it turned OFF. When the fourth control transistor 12 is turned OFF, supply of a bias voltage from a collector of the second control transistor 10 to the bias voltage supply ends VD1, VD2 of the MMIC 30 is stopped, and the MMIC 30 is shifted to the non-amplifying state. Even when a radio-frequency signal is supplied to the radio-frequency signal input terminal 4 at this moment, the radio-frequency signal is blocked at the MMIC 30, and is not supplied to the radio-frequency signal output terminal 5.

When a high level(H) mode control voltage is supplied to the mode control voltage input terminal 14 and the mode control voltage is supplied to the first control transistor 9 while the a positive level bias switching voltage (PA/ON) is supplied to the bias switching voltage input terminal 13, the first control transistor 9 is turned ON and the second control transistor 10 is also turned ON. In this case, since a current flowing from the collector of the fourth control transistor 12 to the bias voltage supply ends VD1, VD2 of the MMIC 30 is supplied to the bias voltage supplying ends VD1, VD2 of the MMIC 30 through the second control transistor 10 in the ON state, the third resistor 18, the sixth resistor 21, and the seventh resistor 22, the bias voltage supplied to the MMIC 30 increases. Therefore, the operating point of the MMIC 30 is set to be shifted from the Class AB to the Class AB close to Class B. By such a setting, an amplifying characteristic for improving the linear performance of the output radio-frequency signal can be obtained in a state in which power consumption of the power amplifier is slightly increased, and hence an output suitable for operation at a high transmission rate can be generated.

When a low-level (L) mode control voltage is supplied to the mode control voltage input terminal 14 and the mode control voltage is supplied to the first control transistor 9 while a positive level bias switching voltage (PA/ON) is supplied to the bias switching voltage input terminal 13, the first control transistor 9 is turned OFF or nearly turned OFF, and the second control transistor 10 is also turned OFF or nearly turned OFF. In this case, a current flowing from the collector of the fourth control transistor 12 to the bias voltage supplying ends VD1, VD2 of the MMIC 30 passes through the sixth resistance 21 for the most part, and then is supplied to the bias voltage supplying ends VD1, VD2 of the MMIC 30 through the sixth resistance 21 and the seventh resistance 22, and thus a bias voltage supplied to the MMIC 30 is lowered. Therefore, the operating point of the MMIC 30 is set to be shifted from Class AB to Class AB close to Class A. By such a setting, an amplifying characteristic that satisfies the linear performance standard of the output radio-frequency signal in a state in which power consumption of the power amplifier is lowered can be obtained, and thus an output suitable for operation at a low transmission rate can be generated.

Figure 4:
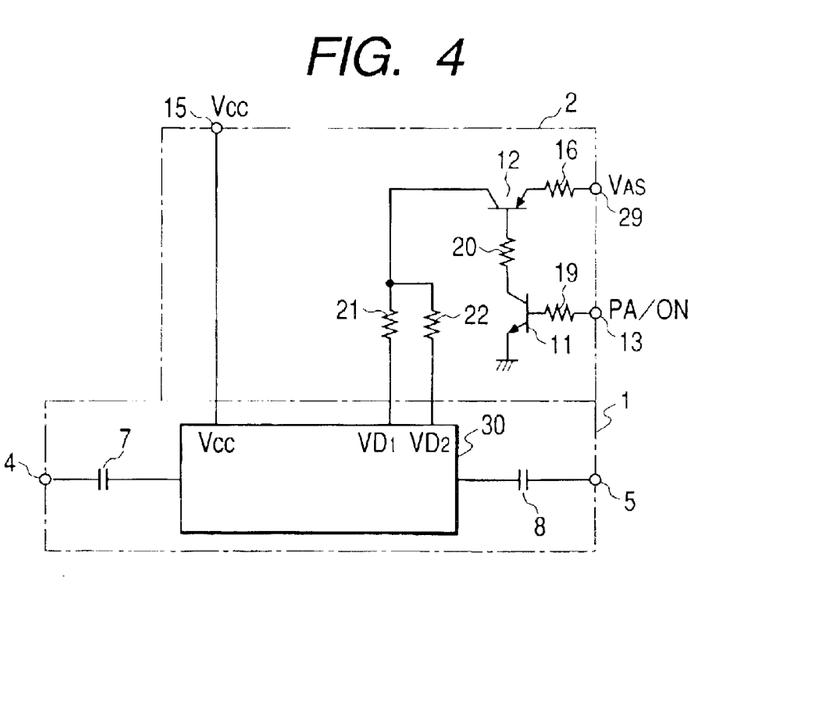
FIG. 4 is a fourth embodiment of a power amplifier that is capable of adjusting operating point according to the present invention, showing a construction of a principal portion.

FIG. 4 is a fourth embodiment of a power amplifier that is capable of adjusting operating point according to the present invention, showing a construction of a principal portion in which a power amplifying stage is constructed of an MMIC.

In FIG. 4, the same components as those shown in FIG. 3 are designated by the same reference numerals. In the description described below, the power amplifier according to the third embodiment is referred to as a third embodiment, and the power amplifier according to the fourth embodiment is referred to as a fourth embodiment.

As shown in FIG. 4, the fourth embodiment includes a power amplifying stage 1, and a bias control circuit 2. The construction of the power amplifying stage 1 is the same as the construction of the power amplifying stage 1 of the third embodiment. The bias control circuit 2 differs in construction in that the third embodiment employs a binary mode control voltage (MC) including a low level (L) and a high level (H) as an operating point adjusting voltage, while the fourth embodiment employs a phased analogue voltage (Vas).

In other words, when comparing the bias control circuit 2 of the fourth embodiment with the bias control circuit 2 of the third embodiment, the fourth embodiment does not include the first control transistor 9, the second control transistor 10, the mode control voltage (MC) input terminal 14, the second resistor 17, and the third resistor 18 as in the third embodiment, and additionally includes a phased analogue voltage (Vas) input terminal 29 instead.

In the fourth embodiment, a fourth control transistor 12 is connected in such a manner that a base is directly connected to a collector of a third control transistor 11 through a fifth resistance 20, an emitter is connected to the phased analogue voltage input terminal 29 through a first resistance 16, the collector is connected to the bias voltage supplying ends VD1, VD2 of the MMIC 30 through a sixth resistance 21 and a seventh resistance 22. Other connecting conditions are the same as those in the third embodiment.

The power amplifier constructed as described above acts as follows.

When a positive level bias switching voltage (PA/ON) is supplied to a bias switching voltage input terminal 13, and then to the third control transistor 11, the third control transistor 11 is turned ON, whereby the collector voltage is lowered. Then, the fourth control transistor 12 is turned ON, and a bias voltage is supplied from the collector to the bias voltage supplying ends VD1, VD2 of the MMIC through the sixth resistance 21 and the seventh resistance 22, and the MMIC 30 is shifted to the amplifying state. When a radio-frequency signal is supplied to the radio-frequency signal input terminal 4 at this moment, the power of the radio-frequency signal is amplified at the MMIC 30 and the amplified radio-frequency signal is supplied to the radio-frequency signal output terminal 5.

On the other hand, when a zero-level bias switching voltage (PA/ON) is supplied to the bias switching voltage input terminal 13, and then to the third control transistor 11, the third control transistor 11 is turned OFF, whereby the fourth control transistor 12 is also turned OFF. When the fourth control transistor 12 is turned OFF, supply of a bias voltage from the collector to the MMIC 30 is stopped, and thus the MMIC 30 is shifted to the non-amplifying state. Even when a radio-frequency signal is supplied to the radio-frequency signal input terminal 4 at this moment, the radio-frequency signal is blocked at the MMIC 30, and is not supplied to the radio-frequency signal output terminal 5.

When an analogue voltage (Vas) at one of the phases is supplied to the phased analogue voltage input terminal 29 while a positive level bias switching voltage (PA/ON) is supplied to the bias switching voltage input terminal 13 and the fourth control transistor 12 is in the ON state, the analogue voltage is transmitted from the collector of the fourth control transistor 12 in the ON state through the sixth resistance 21 and the seventh resistance 22 to the bias voltage supplying ends VD1, VD2 of the MMIC 30 as a bias voltage, and the operating point of the MMIC 30 is set to an operating point corresponding to the analogue voltage value. That is, when the phase of the analogue voltage to be supplied to the analogue voltage input terminal 29 is relatively large and the analogue voltage value is large, the operating point of the MMIC 30 is set to be shifted from the Class AB to the Class AB close to Class A corresponding to the analogue voltage values, and when the phase of the analogue voltage is relatively small, and the analogue voltage value is small, the operating point MMIC 30 is set to be shifted from the Class AB to Class AB close to Class B corresponding to the analogue voltage.

In this embodiment as well, an analogue voltage that is capable of being shifted into eight phases is used as a phased analogue voltage, as an example. At each of eight phases of the analogue voltage, the operating point of the MMIC 30 is set to eight phases; Class AB close to Class B 1, Class AB close to Class B 2, Class AB close to Class B 3, Class AB, Class AB close to Class A 1, Class AB close to Class A 2, Class AB close to Class A 3, and Class AB close to Class A 4. In this case, the smaller the values of Class AB close to Class B 1 to 3, the closer to Class B, and the larger the value of Class AB close to Class A 1 to 4, the value is closer to Class A.

When the operating point of the MMIC 30 is set to Class AB close to Class A, an amplifying characteristic that provides preferable linear performance of the output radio-frequency signal in a state in which power consumption of the power amplifier is slightly increased can be obtained, and an output suitable to the operation at high transmission rate can be generated depending to the setting state. When the operating point of the MMIC 30 is set to Class AB close to Class B, an amplifying characteristic that satisfies the linear performance standard of the output radio-frequency signal can be obtained in a state in which power consumption of the power amplifier is reduced, and thus an output suitable to the operation at a low transmission rate can be generated.

In this manner, according to the power amplifier of the fourth embodiment, an output that is most suitable to that moment can be generated by varying the analogue voltage value of the phased analogue voltage corresponding to the required transmission rates.

In the second embodiment and the fourth embodiment, phased analogue voltage can be set to eight phases. However, the phased analogue voltage according to the present invention is not limited to the setting to eight phases, and the number of phases can be set as desired as far as the number of the phases is at least three.

As described above, according to a first embodiment of the invention, a power amplifying element is adapted to be switched between the amplifying action and the non-amplifying action by supplying a switching voltage to a bias control circuit to eliminate power consumption by the power amplifying element in non-amplifying action, and a supplied bias voltage value may be selected by supplying an operating point adjusting voltage having phased bias voltage values to the bias control circuit. Therefore, the power amplifying element can be set to an operating point suitable to that moment, and thus power consumption of a power amplifying stage can be maintained constantly at the value lower than the limit value, as well as an output signal can be controlled so as to satisfy the linear performance standard.

According to the second embodiment of the invention, the power amplifying element can be set to either one of the operating points suitable to that moment with a relatively simple unit, whereby power consumption of a power amplifying stage can be constantly maintained at a value below the limit value, and the output signal can be controlled to a value satisfying the linear performance standard.

According to a third embodiment of the invention, a power amplifying element can be set to one of the operating point suitable to that moment with high degree of accuracy, whereby power consumption of a power amplifying stage can be constantly maintained at the value below the limit value, and an output signal can be controlled to a value satisfying the linear performance standard.

What is claimed is:

1. A power amplifier capable of adjusting an operating point comprising:
   a power amplifying stage including a power amplifying element having a main electrode and a control electrode; and
   a bias control circuit that is supplied with a bias switching voltage and an operating point adjusting voltage for adjusting a bias voltage value to the control electrode of the power amplifying element by the bias switching voltage and the operating point adjusting voltage and hence adjusting the operating point of the power amplifying element,
   wherein the bias control circuit comprises a unit for adjusting the operating point of the power amplifying element by switching between supply and stop of the bias voltage to the control electrode of the power amplifying element by the bias switching voltage, and varying the bias voltage value to be supplied to the control electrode of the power amplifying element by the operating point adjusting voltage in phase.

2. A power amplifier capable of adjusting an operating point according to claim 1, wherein the operating point adjusting voltage includes a binary voltage for selectively setting to one of two operating points of the power amplifying element.

3. A power amplifier capable of adjusting an operating point according to claim 1, wherein the operating point adjusting voltage includes phased analogue voltages for selectively setting the operating point of the power amplifying element to one of at least three operating points.

4. A power amplifier capable of adjusting an operating point according to claim 1, wherein the power amplifying stage includes independent elements including a power amplifying element.

5. A power amplifier capable of adjusting an operating point according to claim 1, wherein the power amplifying stage includes a Microwave Monolithic Integrated Circuit.

* * * * *